(12) United States Patent
Lin

(10) Patent No.: US 11,231,114 B2
(45) Date of Patent: Jan. 25, 2022

(54) VALVE MEMBER DRIVING DEVICE CAPABLE OF BIDIRECTIONAL MOVEMENT

(71) Applicant: KING LAI HYGIENIC MATERIALS CO., LTD, Zhubei (TW)

(72) Inventor: Cheng-Chimr Lin, Zhubei (TW)

(73) Assignee: KING LAI HYGIENIC MATERIALS CO., LTD, Zhubei (TW)

( * ) Notice: Subject to any disclaimer, the term of this patent is extended or adjusted under 35 U.S.C. 154(b) by 6 days.

(21) Appl. No.: 16/943,435

(22) Filed: Jul. 30, 2020

(65) Prior Publication Data

US 2021/0388908 A1   Dec. 16, 2021

(30) Foreign Application Priority Data

Jun. 11, 2020   (TW) .................. 109119694

(51) Int. Cl.
| | |
|---|---|
| *F16K 3/30* | (2006.01) |
| *F16K 31/48* | (2006.01) |
| *F16K 31/122* | (2006.01) |
| *F16K 51/02* | (2006.01) |

(52) U.S. Cl.
CPC ............ *F16K 3/30* (2013.01); *F16K 31/1225* (2013.01); *F16K 31/485* (2013.01); *F16K 51/02* (2013.01)

(58) Field of Classification Search
CPC .. F16K 31/1225; F16K 31/122; F16K 31/485; F16K 3/18; F16K 3/0281; F16K 3/30; F16K 51/02; F16K 25/02

USPC .......................................... 251/62, 175, 193
See application file for complete search history.

(56) References Cited

U.S. PATENT DOCUMENTS

| | | | | | |
|---|---|---|---|---|---|
| 5,975,492 | A | * | 11/1999 | Brenes ................. | F16K 3/0254 251/175 |
| 6,056,266 | A | * | 5/2000 | Blecha ................. | F16K 3/0218 251/158 |
| 6,899,316 | B2 | * | 5/2005 | Duelli ..................... | F16K 3/188 251/158 |
| 7,422,653 | B2 | * | 9/2008 | Blahnik ............ | H01L 21/67126 118/719 |

(Continued)

FOREIGN PATENT DOCUMENTS

TW    I503914 B    10/2015

*Primary Examiner* — Craig J Price
*Assistant Examiner* — Andrew J Rost
(74) *Attorney, Agent, or Firm* — Muncy, Geissler, Olds & Lowe, P.C.

(57) ABSTRACT

A valve member driving device capable of bidirectional movement includes: a main body with two gas chambers, a first gas-inlet opening, a first gas-inlet channel, a second gas-inlet opening, and a second gas-inlet channel; a first piston rod with a first flow passage; a second piston rod with a second flow passage; a first guide rod extending into the first flow passage at one end and having a gas socket and a gas hole in communication with the gas socket; a second guide rod extending into the second flow passage at one end and having a gas-guiding flow passage; a valve cylinder fixedly provided on the first piston rod and having a valve-cylinder gas chamber, an advance channel, a withdrawal channel, and a valve-cylinder piston rod; and a valve member fixedly provided on the valve-cylinder piston rod.

6 Claims, 13 Drawing Sheets

(56) References Cited

U.S. PATENT DOCUMENTS

| | | | | |
|---|---|---|---|---|
| 7,500,649 | B2* | 3/2009 | Litscher | F16K 3/0254 |
| | | | | 251/326 |
| 7,611,122 | B2* | 11/2009 | Tichy | F16K 3/18 |
| | | | | 251/158 |
| 8,807,527 | B2* | 8/2014 | Kim | H01L 21/67126 |
| | | | | 251/193 |
| 9,404,589 | B2* | 8/2016 | Ishigaki | F16K 51/02 |
| 2006/0124886 | A1* | 6/2006 | Brenes | F16K 3/188 |
| | | | | 251/326 |
| 2006/0249701 | A1* | 11/2006 | Kurita | F16K 3/188 |
| | | | | 251/195 |
| 2013/0214191 | A1* | 8/2013 | Li | F16K 3/0281 |
| | | | | 251/326 |

\* cited by examiner

VALVE MEMBER DRIVING DEVICE CAPABLE OF BIDIRECTIONAL MOVEMENT

BACKGROUND OF THE INVENTION

1. Technical Field

The present invention relates to a gate valve and more particularly to a valve member driving device that can be moved in two directions.

2. Description of Related Art

Taiwan Patent No. 1503914 discloses a two-way gate valve in which a first driving unit is used to operate a first operating body or a second driving unit is used to operate a second operating body in order to displace a push-pull module to the left or to the right and thereby seal one of the two entrances selectively with a first sealing plate or a second sealing plate.

The main technical features of the aforesaid patent consist not only in the use of a pneumatic cylinder in the bottom portion of the gate valve, but also in the use of the crank-like first and second operating bodies in the upper portion of the gate valve, or more particularly in the push-pull module, which is connected to the piston rod of the pneumatic cylinder. The aforesaid patent provides a mechanism by which the sealing plates, which are located between the two entrances, can be selectively moved to one side to seal the corresponding one of the entrances.

It can be known from the above that the mechanism of the aforesaid patent is rather complicated, includes a large number of components, is difficult to assemble, and may have issues with the precision of assembly. Furthermore, the eccentric lateral movement of the sealing plates to selectively seal the left or the right entrance relies on the rotation of, for example, the first operating body, the rotating shafts, and the first and the second sealing plates themselves, and yet the intricate actions involved may not be carried out as accurately as designed.

BRIEF SUMMARY OF THE INVENTION

The primary objective of the present invention is to provide a valve member driving device that can be moved in two directions and that has fewer components, uses simpler valve member driving actions, and features higher precision than its prior art counterparts.

To achieve the above objective, the present invention provides a valve member driving device capable of bidirectional movement. The valve member driving device includes a main body, a first piston rod, a second piston rod, a first guide rod, a second guide rod, a valve cylinder, a valve-cylinder piston rod, and a valve member. The main body is provided therein with two gas chambers that are not in communication with each other. The main body is further provided with a first gas-inlet opening, a first gas-inlet channel, a second gas-inlet opening, and a second gas-inlet channel. The first gas-inlet opening is in communication with the outside and is in communication with the two gas chambers through the first gas-inlet channel. The second gas-inlet opening is in communication with the outside and is in communication with the two gas chambers through the second gas-inlet channel. The first piston rod and the second piston rod are provided in the main body in an extensible and retractable manner. Each of the first and the second piston rods has a piston at one end, and the two pistons are located in the two gas chambers respectively. Both the first piston rod and the second piston rod are partially exposed from the main body and can be driven to move between an extended position and a retracted position. The first piston rod is axially penetrated by a first flow passage, and the second piston rod is axially penetrated by a second flow passage. The first guide rod and the second guide rod are fixedly provided in the main body and are located in the two gas chambers respectively. The first guide rod has one end extending into the first flow passage of the first piston rod, and this extending end of the first guide rod is axially and concavely provided with a gas socket in communication with the first flow passage. A lateral side of the rod body of the first guide rod is provided with a gas hole. When the first piston rod is at the extended position, the gas hole is exposed from the first piston rod and in communication with the gas chamber where the gas socket and the first guide rod are located. When the first piston rod is at the retracted position, the gas hole is in the first flow passage. The second guide rod has one end extending into the second flow passage of the second piston rod. The second guide rod further has a gas-guiding flow passage. The two ends of the gas-guiding flow passage are in communication with the second gas-inlet opening and the second flow passage respectively. The valve cylinder is fixedly provided on the portion of the first piston rod that is exposed from the main body and the portion of the second piston rod that is exposed from the main body. The valve cylinder has a valve-cylinder gas chamber, an advance channel in communication with the valve-cylinder gas chamber and the first flow passage of the first piston rod, and a withdrawal channel in communication with the valve-cylinder gas chamber and the second flow passage of the second piston rod. The valve-cylinder piston rod is provided in the valve cylinder in an extensible and retractable manner and is partially exposed from the valve cylinder. The valve-cylinder piston rod has a valve-cylinder piston at one end, and the valve-cylinder piston is located in the valve-cylinder gas chamber. The direction in which the valve-cylinder piston rod is extended or retracted and the direction in which the first piston rod is extended or retracted form a predetermined included angle. The valve member is fixedly provided on the portion of the valve-cylinder piston rod that is exposed from the valve cylinder. The positions at which the first gas-inlet channel communicates with the two gas chambers correspond to one end of the piston of the first piston rod and one end of the piston of the second piston rod respectively, and the positions at which the second gas-inlet channel communicates with the two gas chambers correspond to the other end of the piston of the first piston rod and the other end of the piston of the second piston rod respectively, such that gas entering the two gas chambers from the first gas-inlet opening can push the first piston rod and the second piston rod toward the extended position. The position at which the advance channel communicates with the valve-cylinder gas chamber corresponds to one end of the valve-cylinder piston, and the position at which the withdrawal channel communicates with the valve-cylinder gas chamber corresponds to the other end of the valve-cylinder piston, such that gas entering the valve-cylinder gas chamber from the advance channel can push the valve-cylinder piston rod outward.

Compared with the prior art, the present invention has fewer components, is easier to assemble, drives the valve member with simpler actions, and has higher precision.

DETAILED DESCRIPTION OF THE INVENTION

Figure 1:
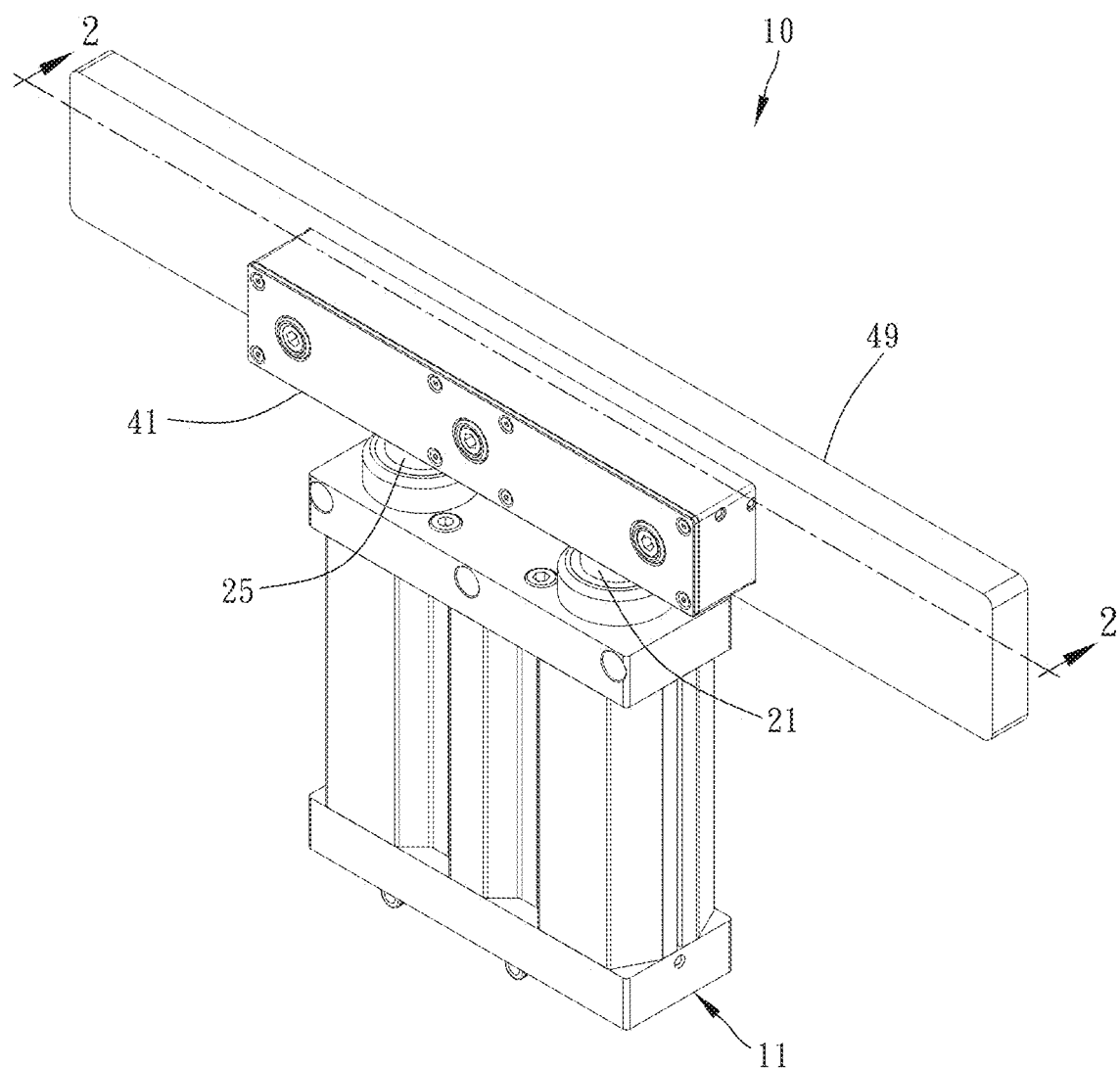
FIG. 1 is an assembled perspective view of the first preferred embodiment of the present invention.
Figure 2:
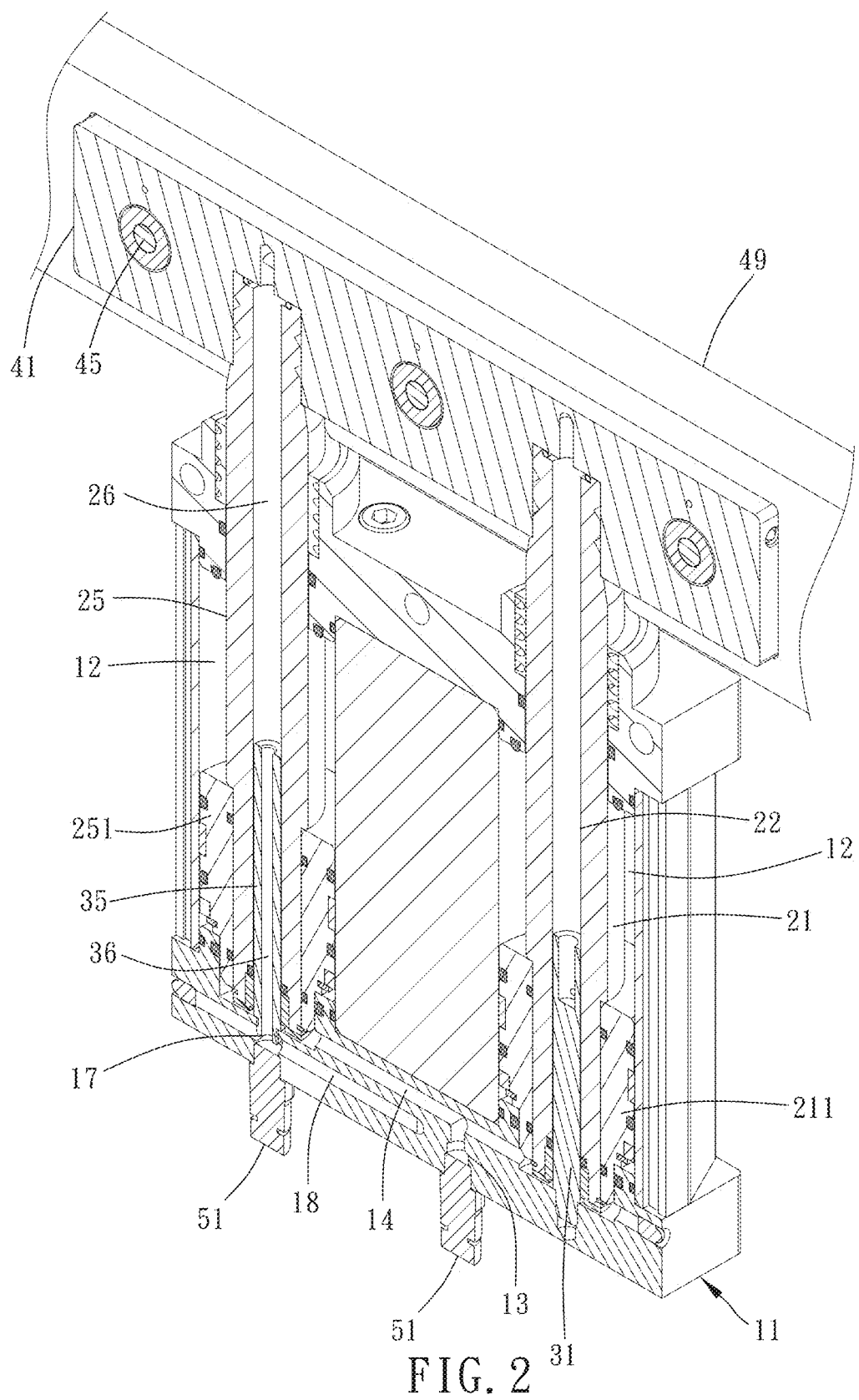
FIG. 2 is a sectional view taken along line 2-2 in FIG. 1.

A preferred embodiment of the present invention is described below with reference to the accompanying drawings to shed light on the technical features of the invention.

As shown in FIG. 1 to FIG. 10, the valve member driving device 10 capable of bidirectional movement according to a preferred embodiment of the present invention is composed essentially of a main body 11, a first piston rod 21, a second piston rod 25, a first guide rod 31, a second guide rod 35, a valve cylinder 41, three valve-cylinder piston rods 45, and a valve member 49.

The main body 11 is provided therein with two gas chambers 12 that are not in communication with each other. The main body 11 is further provided with a first gas-inlet opening 13, a first gas-inlet channel 14, a second gas-inlet opening 17, and a second gas-inlet channel 18. The first gas-inlet opening 13 is in communication with the outside and is in communication with the two gas chambers 12 through the first gas-inlet channel 14. The second gas-inlet opening 17 is in communication with the outside and is in communication with the two gas chambers 12 through the second gas-inlet channel 18.

Figure 3:
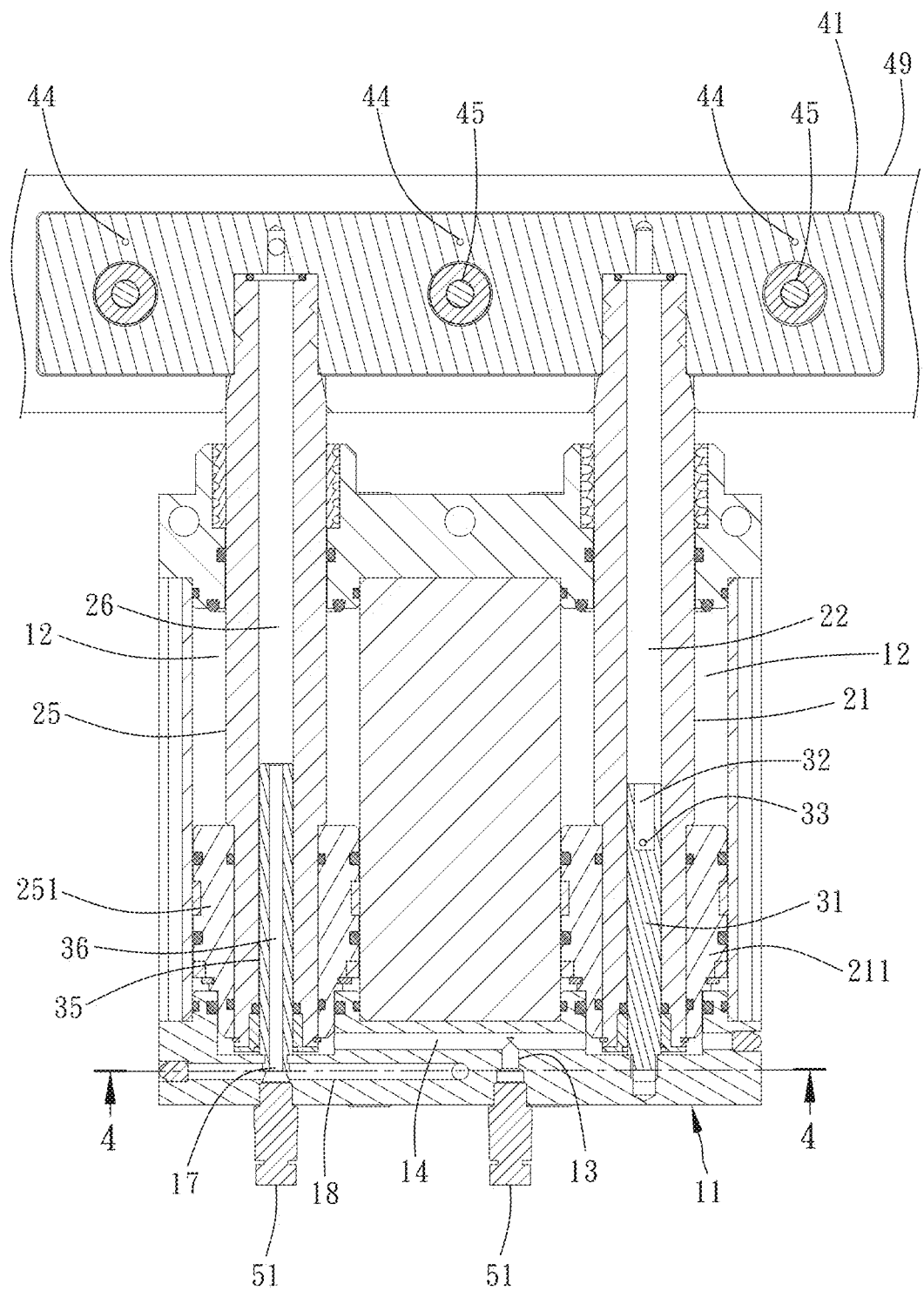
FIG. 3 is a front view of FIG. 2.
Figure 4:
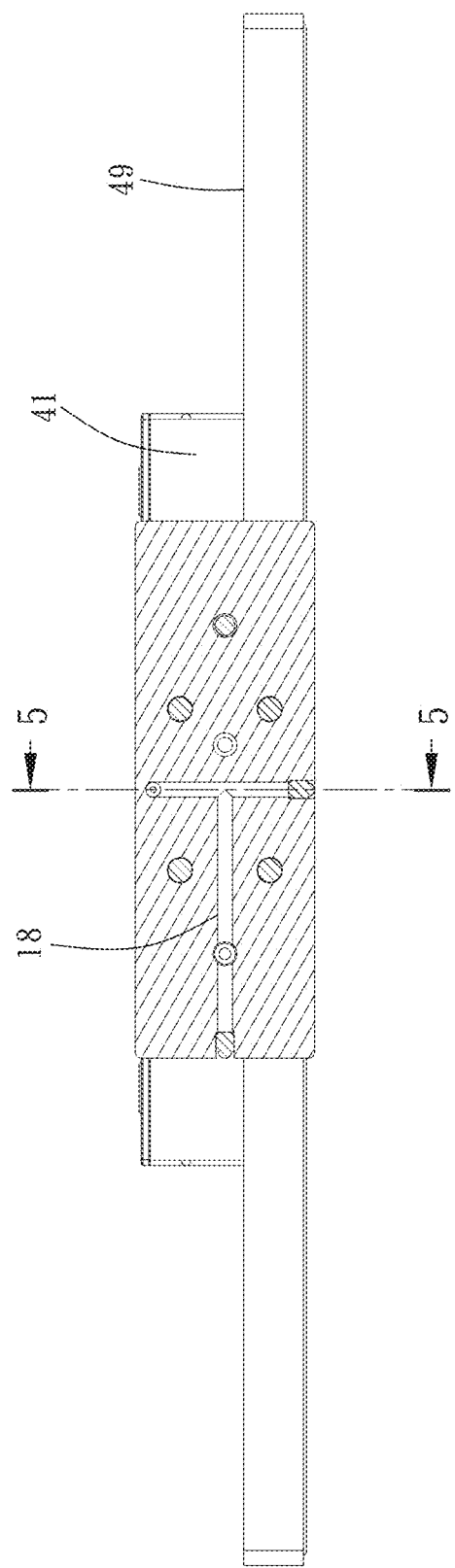
FIG. 4 is a sectional view taken along line 4-4 in FIG. 3.
Figure 5:
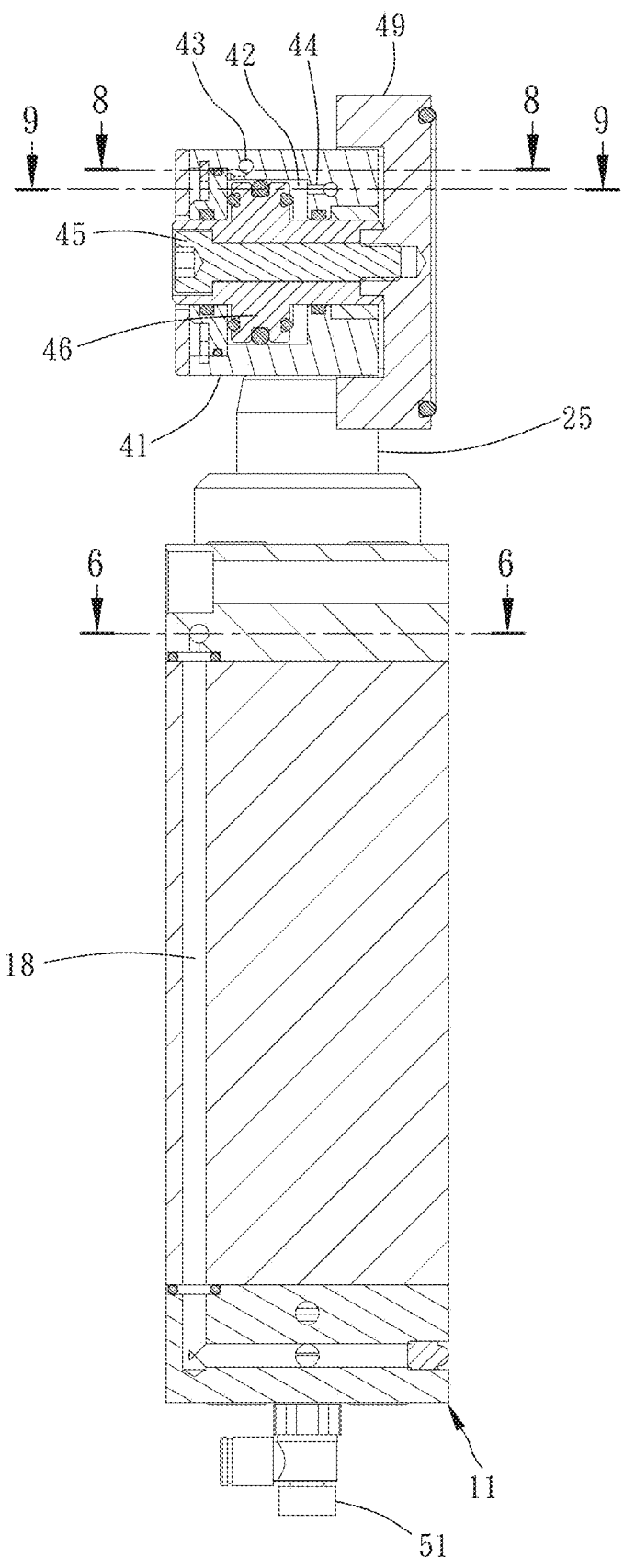
FIG. 5 is a sectional view taken along line 5-5 in FIG. 4.
Figure 6:
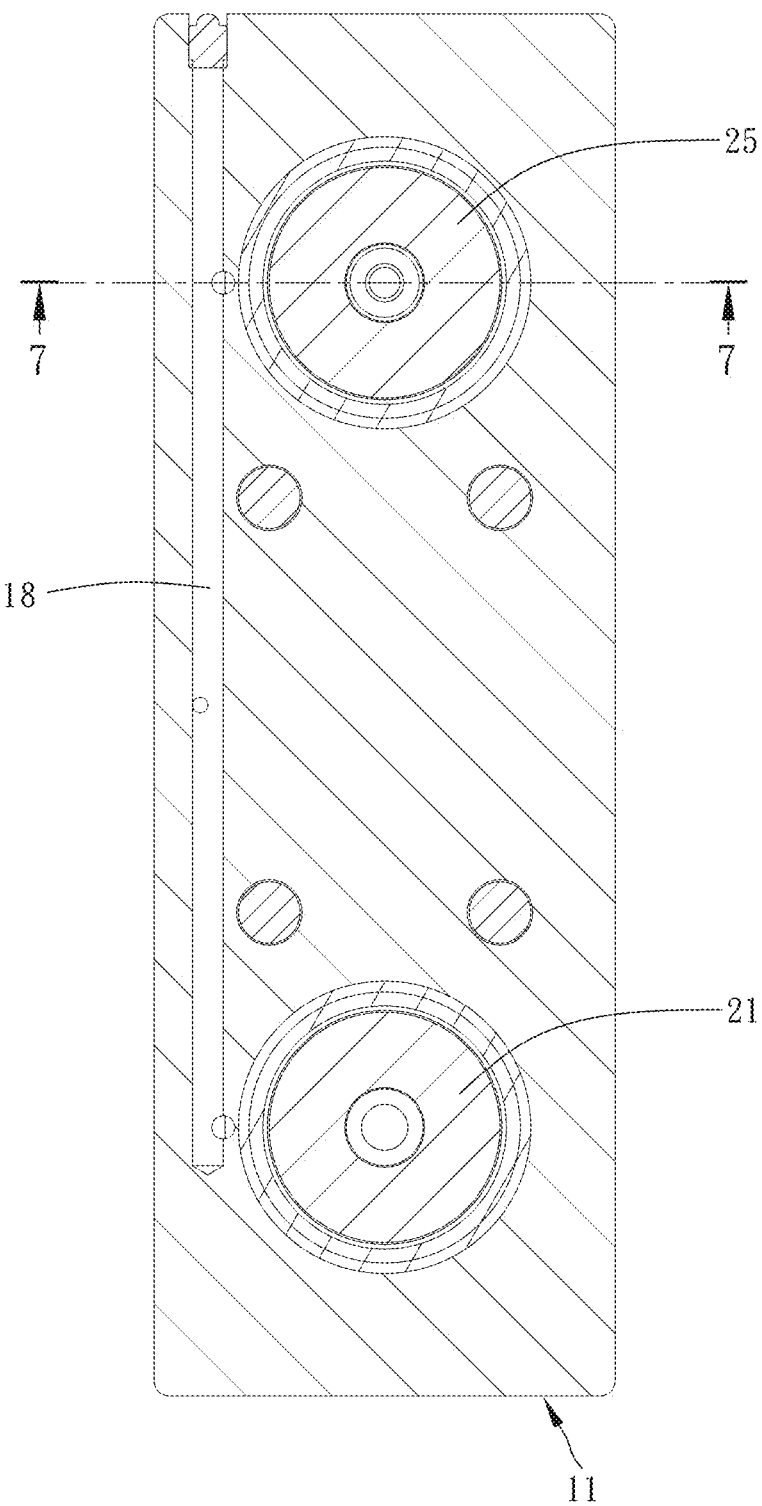
FIG. 6 is a sectional view taken along line 6-6 in FIG. 5.
Figure 7:
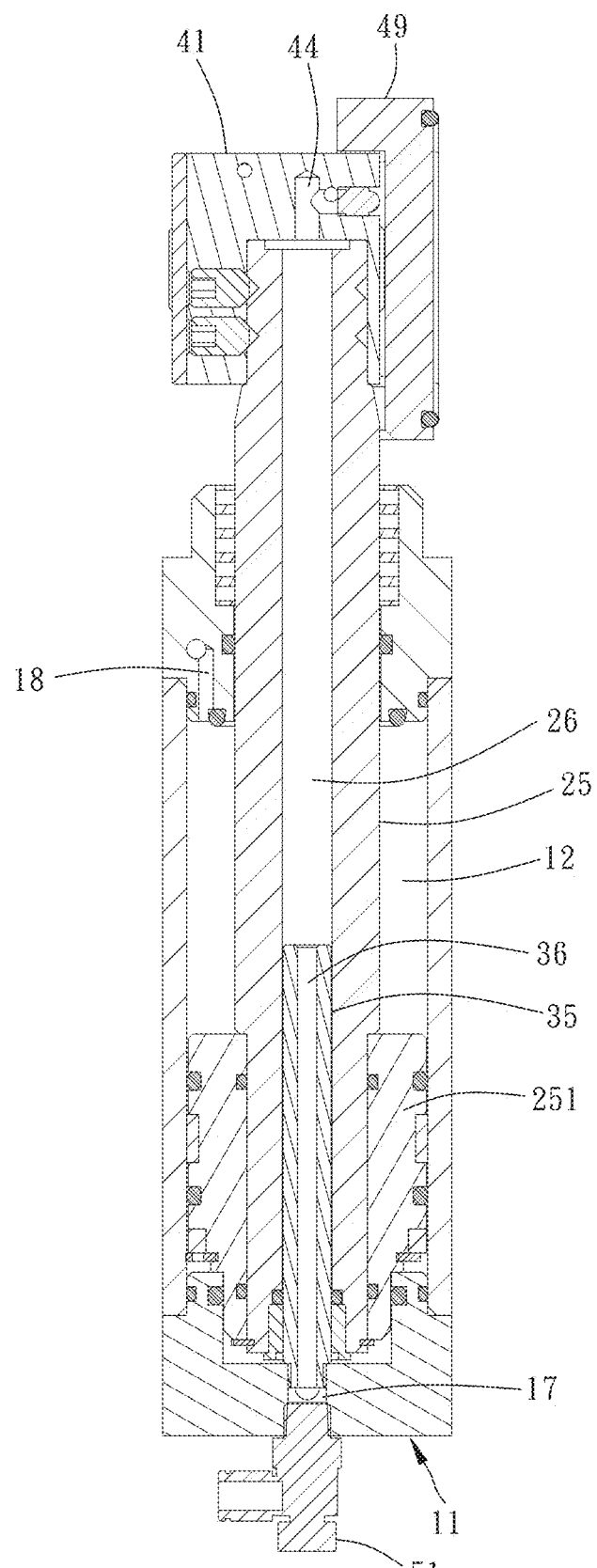
FIG. 7 is a sectional view taken along line 7-7 in FIG. 6.
Figure 8:
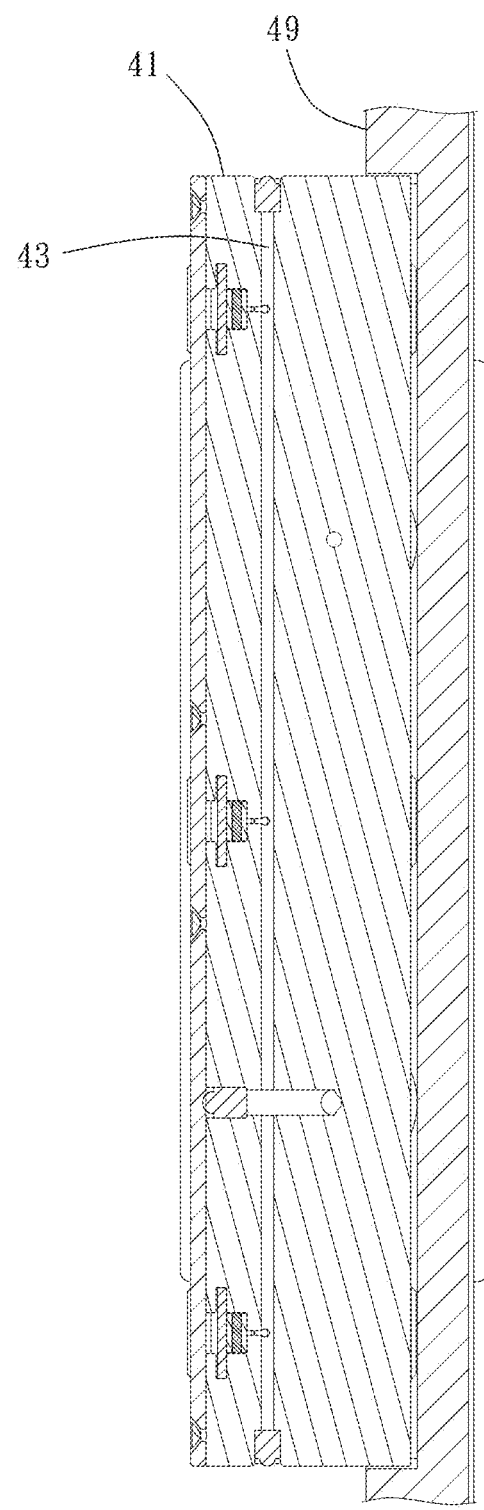
FIG. 8 is a sectional view taken along line 8-8 in FIG. 5.
Figure 9:
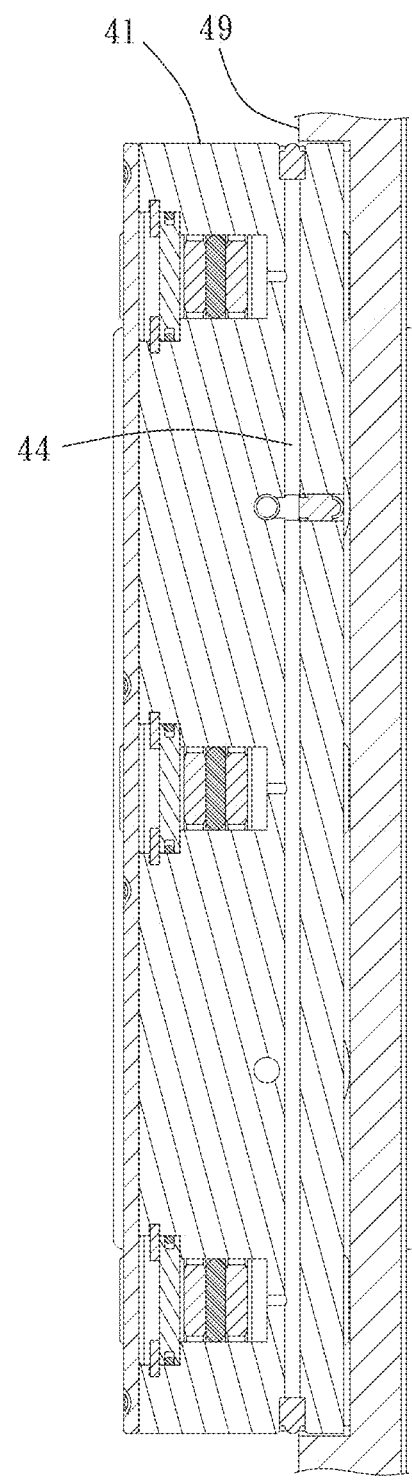
FIG. 9 is a sectional view taken along line 9-9 in FIG. 5.
Figure 10:
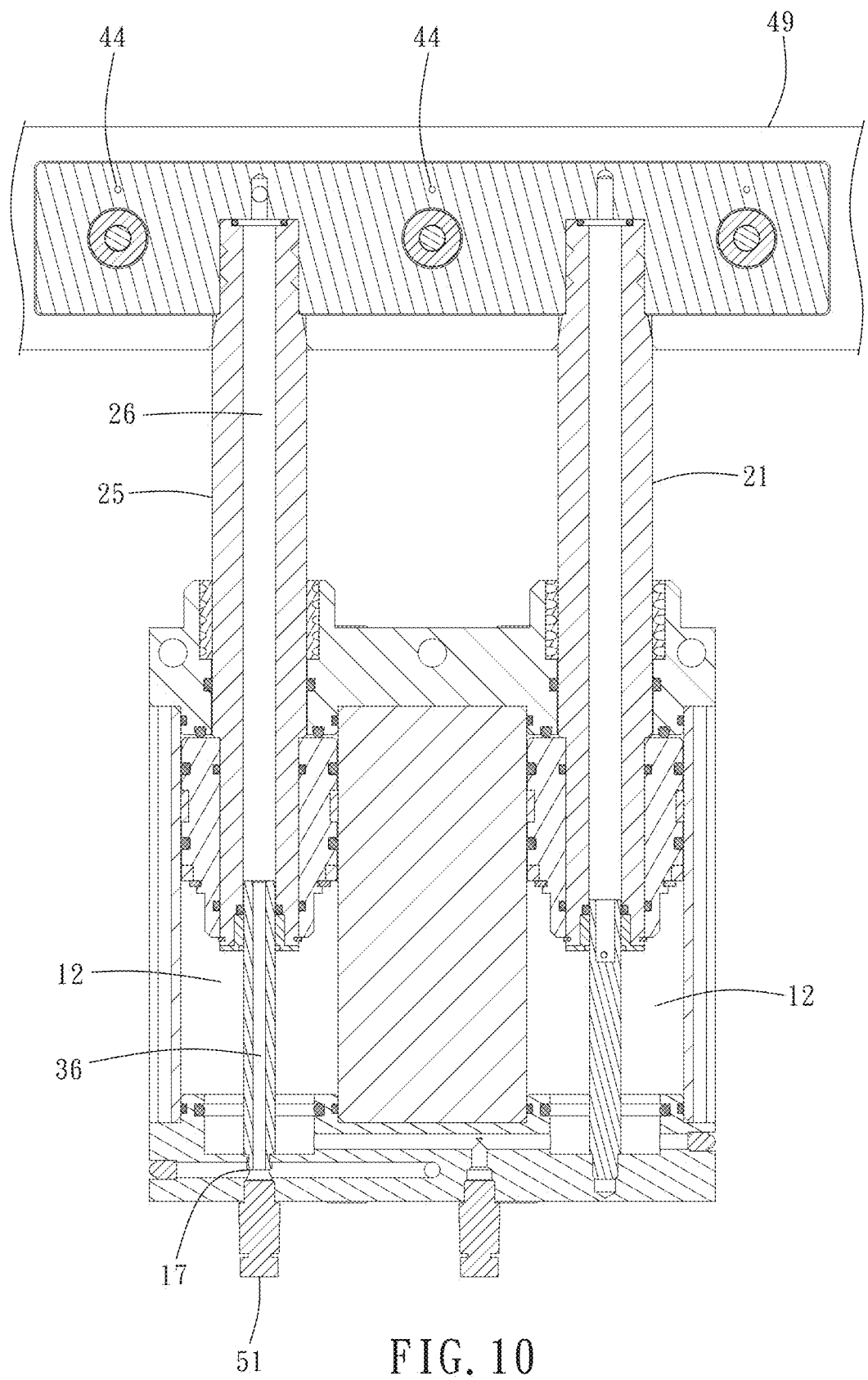
FIG. 10 shows a state of use of the first preferred embodiment of the invention.

The first piston rod 21 and the second piston rod 25 are provided in the main body 11 in an extensible and retractable manner. Each of the first and the second piston rods has a piston 211,251 at one end, and the two pistons 211 and 251 are located in the two gas chambers 12 respectively. Both piston rods are partially exposed from the main body 11 and can be driven to move between an extended position (as shown in FIG. 10, which shows the two piston rods at the highest position to which they can be raised) and a retracted position (as shown in FIG. 3, which shows the two piston rods at the lowest position to which they can be lowered). The first piston rod 21 is axially penetrated by a first flow passage 22, and the second piston rod 25 is axially penetrated by a second flow passage 26.

The first guide rod 31 and the second guide rod 35 are fixedly provided in the main body 11 and are located in the two gas chambers 12 respectively. The first guide rod 31 has one end extending into the first flow passage 22 of the first piston rod 21, and this extending end of the first guide rod 31 is axially and concavely provided with a gas socket 32 that is in communication with the first flow passage 22. Also, a lateral side of the rod body of the first guide rod 31 is provided with a gas hole 33. When the first piston rod 21 is at the extended position, the gas hole 33 is exposed from the first piston rod 21 and in communication with the gas chamber 12 where the gas socket 32 and the first guide rod 31 are located. When the first piston rod 21 is at the retracted position, however, the gas hole 33 is in the first flow passage 22. The second guide rod 35 has one end extending into the second flow passage 26 of the second piston rod 25. The second guide rod 35 further has a gas-guiding flow passage 36. The two ends of the gas-guiding flow passage 36 are in communication with the second gas-inlet opening 17 and the second flow passage 26 respectively. In an actual design, the gas hole 33 may be so located that it is not exposed from the first piston rod 21 until the first piston rod 21 arrives at the extended position. This design ensures that gas is allowed to enter the gas hole 33 only when the first piston rod 21 has been moved exactly to the extended position.

The valve cylinder 41 is fixedly provided on the portion of the first piston rod 21 that is exposed from the main body 11 and the portion of the second piston rod 25 that is exposed from the main body 11. In this embodiment, the valve cylinder 41 is provided at one end of the first piston rod 21 and one end of the second piston rod 25. The valve cylinder 41 has three valve-cylinder gas chambers 42, an advance channel 43 that is in communication with each valve-cylinder gas chamber 42 and the first flow passage 22 of the first piston rod 21, and a withdrawal channel 44 that is in communication with each valve-cylinder gas chamber 42 and the second flow passage 26 of the second piston rod 25.

The three valve-cylinder piston rods 45 are provided in the valve cylinder 41 in an extensible and retractable manner and are partially exposed from the valve cylinder 41. Each valve-cylinder piston rod 45 has a valve-cylinder piston 46 at one end, and the valve-cylinder pistons 46 are located in the valve-cylinder gas chambers 42 respectively. The direction in which the three valve-cylinder piston rods 45 are extended or retracted and the direction in which the first piston rod 21 and the second piston rod 25 are extended or retracted form a predetermined included angle, which in this embodiment is 90 degrees, meaning the two directions are perpendicular to each other.

The valve member 49 is fixedly provided on the portions of the three valve-cylinder piston rods 45 that are respectively exposed from the valve cylinder 41. In this embodiment, the valve member 49 is provided at one end of the three valve-cylinder piston rods 45.

The positions at which the first gas-inlet channel 14 communicates with the two gas chambers 12 correspond to one end of the piston 211 and one end of the piston 251 respectively, and the positions at which the second gas-inlet channel 18 communicates with the two gas chambers 12 correspond to the other end of the piston 211 and the other end of the piston 251 respectively. Thus, gas that enters the two gas chambers 12 from the first gas-inlet opening 13 can push the first piston rod 21 and the second piston rod 25 toward the extended position, and gas that enters the two gas chambers 12 from the second gas-inlet opening 17 can push the first piston rod 21 and the second piston rod 25 toward the retracted position. In addition, the position at which the advance channel 43 communicates with each valve-cylinder gas chamber 42 corresponds to one end of the corresponding valve-cylinder piston 46, and the position at which the withdrawal channel 44 communicates with each valve-cylinder gas chamber 42 corresponds to the other end of the corresponding valve-cylinder piston 46. Thus, gas that enters each valve-cylinder gas chamber 42 from the advance channel 43 can push the corresponding valve-cylinder piston rod 45 outward, and gas that enters each valve-cylinder gas chamber 42 from the withdrawal channel 44 can push the corresponding valve-cylinder piston rod 45 back to the retracted state.

When implementing the present invention, each of the first gas-inlet opening 13 and the second gas-inlet opening 17 may be provided with a nozzle 51 to facilitate connection with an external gas source (not shown).

Having detailed the structure of the foregoing embodiment, this specification continues to describe how the embodiment works.

Figure 11:
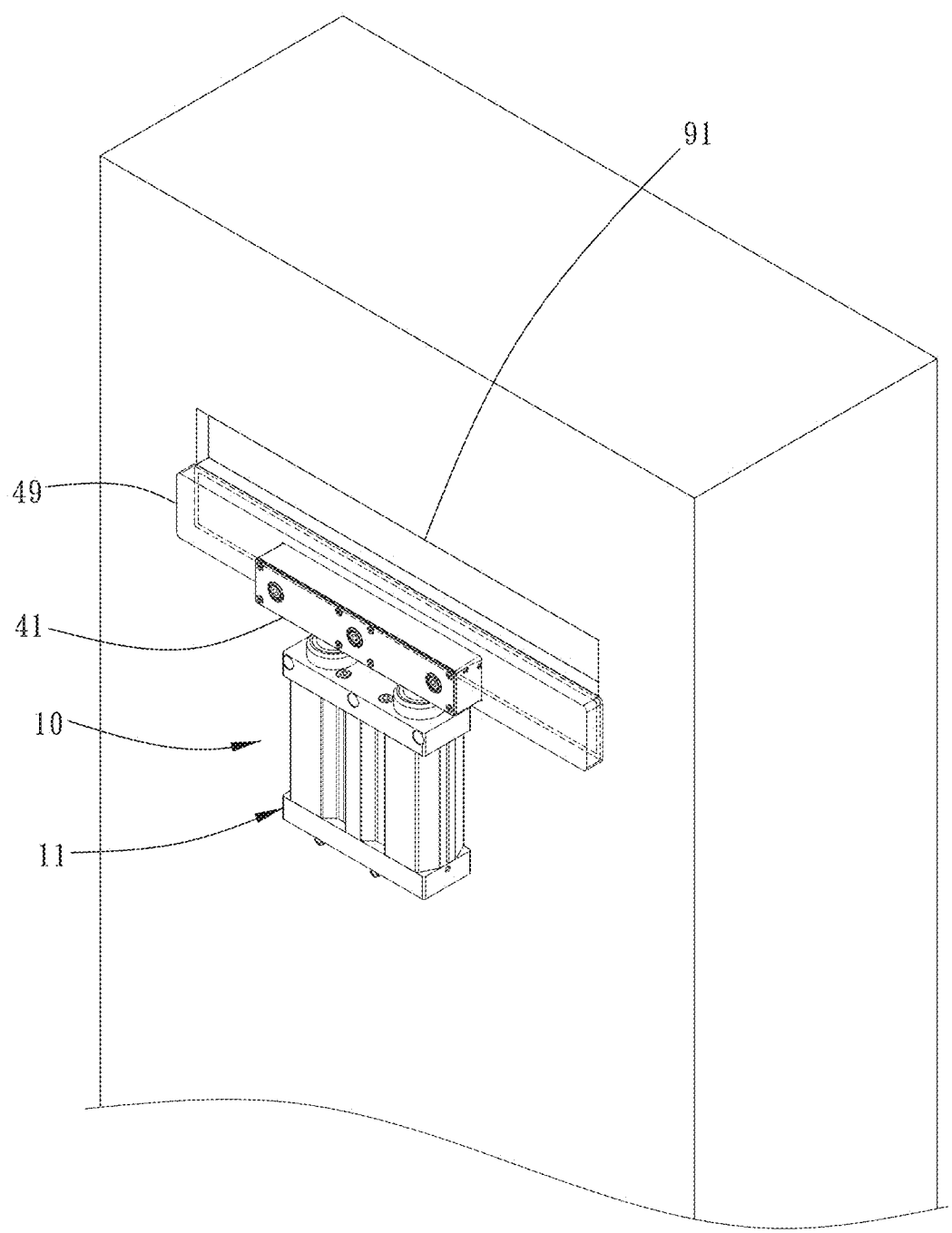
FIG. 11 shows the first preferred embodiment of the invention mounted in place.

Before use, referring to FIG. 11, the valve member driving device 10 is mounted beside a valve opening 91. When the valve member driving device 10 is not yet operated, both the first piston rod 21 and the second piston rod 25 are in the retracted position, and so are the valve-cylinder piston rods 45. The valve member 49 is now at the lowest position and in a horizontally retracted state. The valve opening 91 is therefore not closed.

Figure 12:
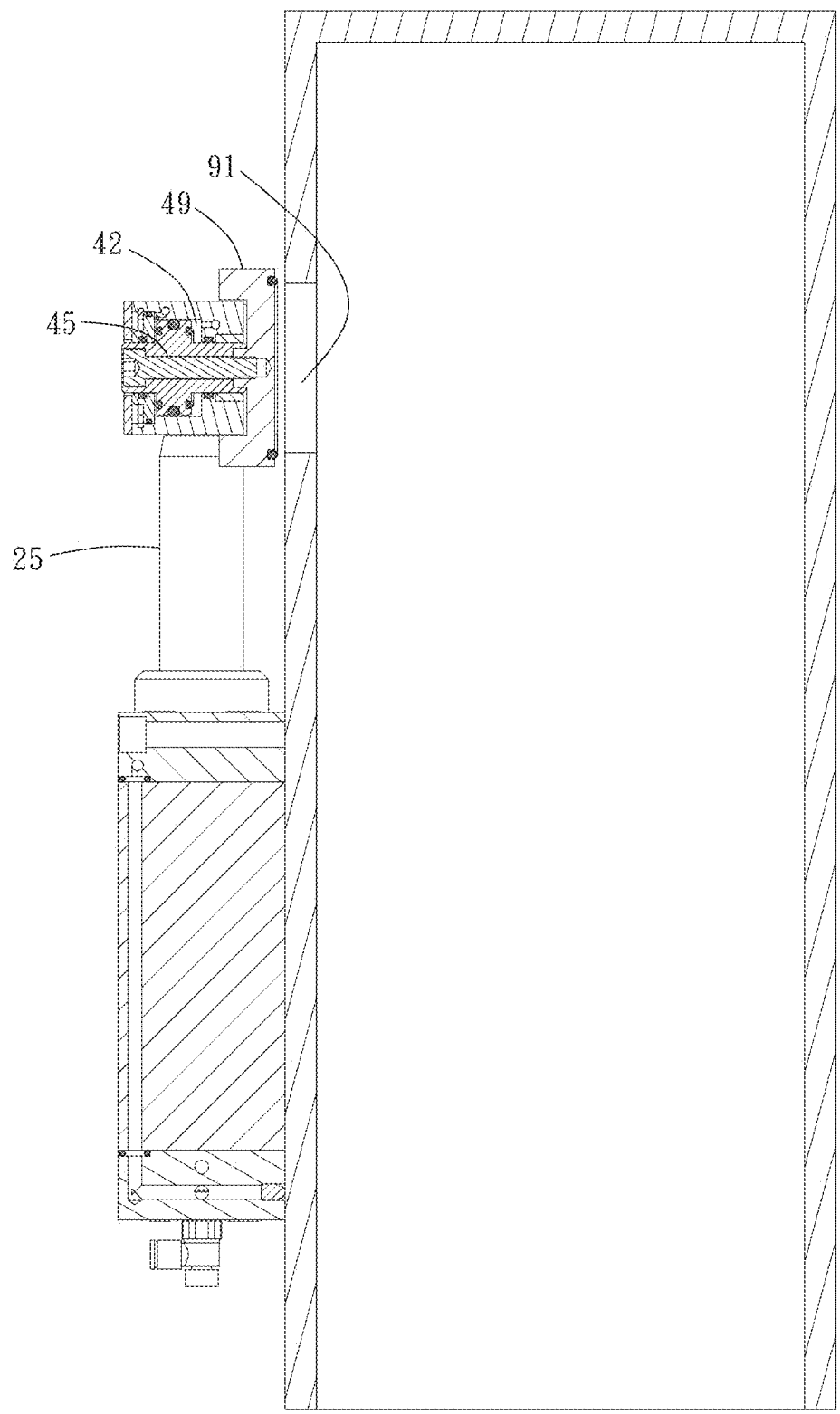
FIG. 12 shows a state of use of the first preferred embodiment of the invention after it is mounted in place
Figure 13:
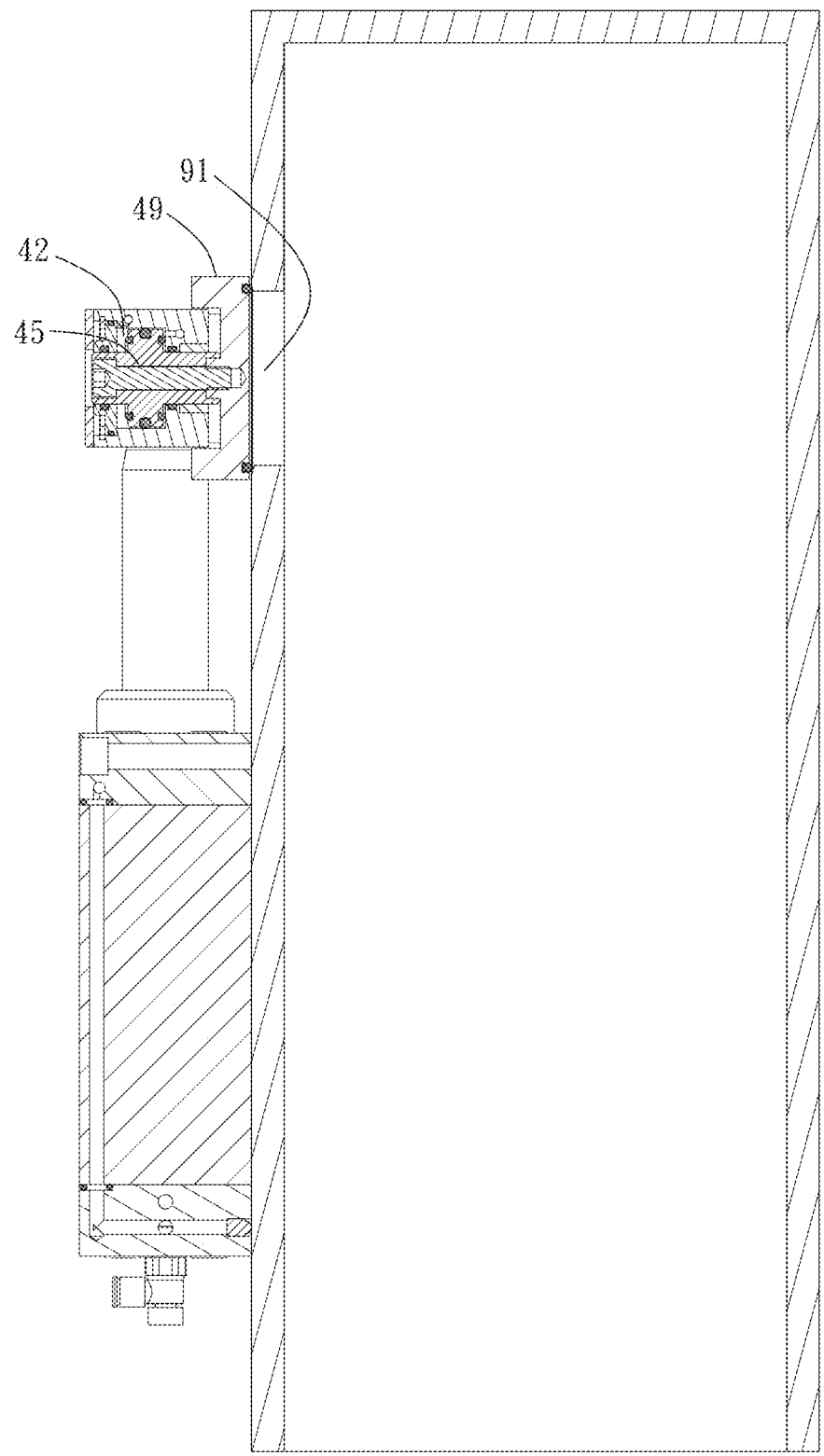
FIG. 13 shows another state of use of the first preferred embodiment of the invention after it is mounted in place.

When it is desired to close the valve opening 91, a closing operation is performed on the valve member driving device 10 as follows. Referring to FIG. 3, gas is introduced into the first gas-inlet opening 13 through the corresponding nozzle 51 and enters the two gas chambers 12. As a result, the first piston rod 21 and the second piston rod 25 are pushed toward the extended position, and the valve cylinder 41 is moved along with the first piston rod 21 and the second piston rod 25. Now that the gas hole 33 of the first guide rod 31 has yet to be exposed to the gas chamber 12 where the first guide rod 31 is located, the gas has not yet entered the gas hole 33. The first piston rod 21 keeps being pushed and eventually reaches the extended position as shown in FIG. 10 and FIG. 12. Once the first piston rod 21 is at the extended position, referring to FIG. 10 and FIG. 5, the gas hole 33 is exposed from the first piston rod 21, so the gas in the gas chamber 12 where the gas hole 33 is located enters the gas hole 33 and flows through the gas socket 32, the first flow passage 22, and the advance channel 43 into the three valve-cylinder gas chambers 42, thereby pushing the valve-cylinder piston rods 45 outward to the outermost position, where the valve member 49 covers, i.e., produces a closing effect on, the valve opening 91 as shown in FIG. 13.

When it is desired to withdraw the valve member 49, a withdrawing operation is performed on the valve member driving device 10 as follows. Referring to FIG. 10 and FIG. 13, gas is introduced into the second gas-inlet opening 17 through the other nozzle 51 and enters the two gas chambers 12 and the gas-guiding flow passage 36. The gas then flows through the second flow passage 26 and the withdrawal channel 44 into the three valve-cylinder gas chambers 42 such that the pressure of the gas pushes the three valve-cylinder piston rods 45 back to their retracted position and the first piston rod 21 and the second piston rod 25 back to their retracted position too. The valve member 49 is thus moved back to the unoperated position shown in FIG. 3.

According to the above, the closing operation causes the first piston rod 21 and the second piston rod 25 to rise to the extended position before the three valve-cylinder piston rods 45 are extended, and the valve member 49 to rise before being horizontally displaced to cover the valve opening 91. When the withdrawing operation is performed, however, the valve member 49 is horizontally retracted and lowered at the same time. In an alternative design, the valve member 49 is horizontally retracted before being lowered, and this can be achieved by making the diameter of the smallest-diameter portion of the path formed by the second gas-inlet opening 17 and the second gas-inlet channel 18 smaller than the diameter of the smallest-diameter portion of the path formed by the second gas-inlet opening 17, the gas-guiding flow passage 36, the second flow passage 26, and the withdrawal channel 44. This alternative design makes it easier for gas to enter the withdrawal channel 44 than to enter the second gas-inlet channel 18, thereby ensuring that when the withdrawing operation is performed, gas will preferentially enter the withdrawal channel 44 to retract the three valve-cylinder piston rods 45 to the greatest extent before entering the second gas-inlet channel 18 to push the first piston rod 21 and the second piston rod 25 downward. For example, the aforesaid diameter difference can be produced by using the gap between the second gas-inlet opening 17 and the corresponding nozzle 51 as the path portion with the smaller diameter, and by enabling direct communication between the same nozzle 51 and the gas-guiding flow passage 36 so as to form a larger path diameter than the gap between the same nozzle 51 and the second gas-inlet opening 17, thereby allowing the horizontal retraction of the valve member 49 to precede the lowering of the valve member 49 when the withdrawing operation is performed.

It can be known from the above that the gas flow passage design of the present invention allows two sets of piston rods that extend respectively in two directions to move separately so that the valve member 49 can be moved in the two directions. The invention does not rely on the rotation or lateral movement of a multiple-component mechanism and therefore has fewer components than the prior art. Furthermore, the operation for driving the valve member 49 is simpler than in the prior art, and the extension and retraction of a piston rod in a pneumatic cylinder are more precise than the lateral movement or rotation of mechanical components.

It should be pointed out that the second gas-inlet opening 17 can serve as a gas outlet when the first gas-inlet opening 13 serves as a gas inlet, and that the first gas-inlet opening 13 can serve as a gas outlet when the second gas-inlet opening 17 serves as a gas inlet. Besides, oil seals (or O-rings) configured for airtight purposes are well known in the art and therefore are not described herein but only shown in the drawings. The positions of the oil seals do not constitute an essential feature of the present invention and hence do not impose limitations on the scope of the invention.

What is claimed is:

1. A valve member driving device capable of bidirectional movement, comprising:

a main body provided therein with two gas chambers that are not in communication with each other, the main body being further provided with a first gas-inlet opening, a first gas-inlet channel, a second gas-inlet opening, and a second gas-inlet channel, wherein the first gas-inlet opening is in communication with an external environment and is in communication with the two gas chambers through the first gas-inlet channel, and the second gas-inlet opening is in communication with the external environment and is in communication with the two gas chambers through the second gas-inlet channel;

a first piston rod and a second piston rod, both extensibly and retractably provided in the main body, wherein each of the first piston rod and the second piston rod has an end with a piston, the two pistons are located in the two gas chambers respectively, both the first piston rod and the second piston rod are partially exposed from the main body and are movable between an extended position and a retracted position when driven, the first piston rod is axially penetrated by a first flow passage, and the second piston rod is axially penetrated by a second flow passage;

a first guide rod and a second guide rod, both fixedly provided in the main body, wherein the first guide rod and the second guide rod are located in the two gas chambers respectively, the first guide rod has an end extending into the first flow passage of the first piston rod, the end of the first guide rod is axially and concavely provided with a gas socket in communication with the first flow passage, the first guide rod further has a rod body with a lateral side provided with a gas hole, the gas hole is exposed from the first piston rod, and hence in communication with the gas chamber where the gas socket and the first guide rod are located, when the first piston rod is at the extended position, the gas hole is in the first flow passage when the first piston rod is at the retracted position, the second guide rod has an end extending into the second flow passage of the second piston rod, the second guide rod further has a gas-guiding flow passage, and the gas-guiding flow passage has two ends that are in communication with the second gas-inlet opening and the second flow passage respectively;

a valve cylinder fixedly provided on a portion of the first piston rod that is exposed from the main body and a portion of the second piston rod that is exposed from the main body, wherein the valve cylinder has a valve-cylinder gas chamber, an advance channel in communication with the valve-cylinder gas chamber and the first flow passage of the first piston rod, and a withdrawal channel in communication with the valve-cylinder gas chamber and the second flow passage of the second piston rod;

a valve-cylinder piston rod extensibly and retractably provided in the valve cylinder and partially exposed from the valve cylinder, wherein the valve-cylinder piston rod has an end with a valve-cylinder piston located in the valve-cylinder gas chamber, and a direction in which the valve-cylinder piston rod is extended or retracted and a direction in which the first piston rod is extended or retracted form a predetermined included angle; and a valve member fixedly provided on a portion of the valve-cylinder piston rod that is exposed from the valve cylinder;

wherein positions at which the first gas-inlet channel communicates with the two gas chambers correspond to an end of the piston of the first piston rod and an end of the piston of the second piston rod respectively, and positions at which the second gas-inlet channel communicates with the two gas chambers correspond to an opposite end of the piston of the first piston rod and an opposite end of the piston of the second piston rod respectively, such that gas entering the two gas chambers from the first gas-inlet opening is able to push the first piston rod and the second piston rod toward the extended position;

wherein a position at which the advance channel communicates with the valve-cylinder gas chamber corresponds to an end of the valve-cylinder piston, and a position at which the withdrawal channel communicates with the valve-cylinder gas chamber corresponds to an opposite end of the valve-cylinder piston, such that gas entering the valve-cylinder gas chamber from the advance channel is able to push the valve-cylinder piston rod outward.

2. The valve member driving device capable of bidirectional movement as claimed in claim 1, wherein the direction in which the valve-cylinder piston rod is extended or retracted is perpendicular to the direction in which the first piston rod and the second piston rod are extended or retracted.

3. The valve member driving device capable of bidirectional movement as claimed in claim 1, wherein the valve cylinder has a plurality of said valve-cylinder gas chambers, a plurality of said valve-cylinder piston rods are extensibly and retractably provided in the valve cylinder, the valve member is fixedly provided on portions of the valve-cylinder piston rods that are respectively exposed from the valve cylinder, and each of the withdrawal channel and the advance channel is in communication with the valve-cylinder gas chambers.

4. The valve member driving device capable of bidirectional movement as claimed in claim 1, wherein a smallest-diameter portion of a path formed by the second gas-inlet opening and the second gas-inlet channel has a smaller diameter than a smallest-diameter portion of a path formed by the second gas-inlet opening, the gas-guiding flow passage, the second flow passage, and the withdrawal channel.

5. The valve member driving device capable of bidirectional movement as claimed in claim 1, wherein each of the first gas-inlet opening and the second gas-inlet opening is provided with a nozzle.

6. The valve member driving device capable of bidirectional movement as claimed in claim 5, wherein a smallest-diameter portion of a path formed by the second gas-inlet opening, the nozzle connected to the second gas-inlet opening, and the second gas-inlet channel has a smaller diameter than a smallest-diameter portion of a path formed by the second gas-inlet opening, the nozzle connected to the second gas-inlet opening, the gas-guiding flow passage, the second flow passage, and the withdrawal channel.

* * * * *